United States Patent [19]

Gundry

[11] 3,810,035

[45] May 7, 1974

[54] CONTROLLED RESISTANCE DEVICES AND ATTENUATORS

[75] Inventor: Kenneth James Gundry, London, England

[73] Assignee: Dolby Laboratories, Inc., New York, N.Y.

[22] Filed: Sept. 28, 1972

[21] Appl. No.: 292,922

[30] Foreign Application Priority Data

Oct. 4, 1971 Great Britain .................... 46121/71

[52] U.S. Cl. ........................ 330/86, 330/28, 330/29, 330/145, 330/156, 307/264

[51] Int. Cl. ................................................ H02g 3/22

[58] Field of Search ......... 330/28, 29, 86, 156, 145; 307/264

[56] References Cited

UNITED STATES PATENTS

| | | | |
|---|---|---|---|
| 2,946,969 | 7/1960 | Rosen | 330/145 X |
| 3,643,173 | 2/1972 | Whitten | 330/28 X |

FOREIGN PATENTS OR APPLICATIONS

| | | | |
|---|---|---|---|
| 1,287,142 | 1/1969 | Germany | 330/28 |

OTHER PUBLICATIONS

Haagen, "Fet Varies Q of Tuned Circuit by Several Thousand", Electronics, Sept. 29, 1969, p. 95.
Marosi, "Negative Impedance Converter Does Double Duty", Electronics, July 24, 1967, pp. 87, 88.

*Primary Examiner*—Herman Karl Saalbach
*Assistant Examiner*—James B. Mullins
*Attorney, Agent, or Firm*—Dike, Bronstein, Roberts & Cushman; Robert F. O'Connell

[57] ABSTRACT

A controlled impedance device such as an attenuator is formed by parallel connected bipolar transistors and a network so applying a control signal to their bases that, as the control signal increases, the transistors commence to conduct progressively. A bootstrapped variable attenuator is formed by a variable attenuator connected in series with an impedance between the output and input of a high input impedance amplifier.

5 Claims, 7 Drawing Figures

PATENTED MAY 7 1974 3,810,035

CONTROLLED RESISTANCE DEVICES AND ATTENUATORS

This invention relates to controlled impedance devices and to variable attenuators. The invention is particularly, but not exclusively, applicable in the manufacture of silicon integrated circuits containing variable audio attenuators.

It is known to use a FET as a variable resistance device with very precise resistance versus control voltage characteristics. An example of a situation in which a FET is so used will be found in British Pat. specification No. 1,279,634. It will be noted that the circuit in FIG. 4 of the drawings accompanying the complete specification of the said specification comprises a substantial number of junction or bipolar transistors and a single FET used as a controlled variable resistance. This does not cause any problems when the circuit is constructed from discrete components; there is a problem, however, if integrated circuit techniques are employed. Integrated circuit techniques can be used to construct bipolar transistors or FETs, but it is difficult and expensive to provide both bipolar transistors and FETs in the same integrated circuit.

The collector-emitter path of a bipolar transistor can be used as a variable impedance whose value is controlled by the base current, provided the potential between the emitter and the collector is small. However, the resistance versus control signal law is critically dependent on the detailed characteristics of the transistor used and it is not possible to use a transistor in this way in production equipment.

One object of the present invention is to provide a circuit which enables a controlled resistance law to be achieved reproducibly using bipolar transistors which do not have to be manufactured to or selected within tight tolerances.

According to the present invention there is provided a controlled impedance device comprising a plurality of bipolar transistors having their emitter-collector paths connected in parallel between first and second terminals and their bases connected to a control terminal by means of a network of impedances such that, as a control signal applied to the control terminal is increased, the transistors commence to conduct progressively. The emitters may be connected directly to the first terminal and the collectors may be connected to the second terminal through individual impedances. However, to achieve more control over the resistance characteristics, the collectors may be connected to the second terminal by way of a ladder network. Similarly, the control terminal may be connected to the bases by means of individual potential dividers which establish different thresholds for conduction of the different transistors but, again to achieve more control, a ladder network may be employed.

In the embodiment described below, the impedances may all be resistors but it will be appreciated that reactive impedances can be incorporated if required to shape the characteristics versus frequency.

Although intended primarily for integrated circuit applications the circuits can equally be constructed from discrete components.

The number of transistors employed is a compromise. The more transistors that are used, the easier it is to arrange that the impedance versus control signal law is determined predominantly by the characteristics of the base and collector networks and only to a small extent by the characteristics of the transistors themselves. Obviously, however, it is uneconomical to employ too many transistors. In practice, reasonable control over the impedance law will not be obtained with fewer than three transistors, and it will be desirable to use five or more transistors.

If the circuits are required to give a predetermined impedance versus control signal law, the impedances in the collector circuits must have values of the same order of magnitude as the required overall impedance Z. In particular, if all the impedances are resistors, high values may be required. At the present stage of technology, it is difficult and expensive to incorporate high-value resistors in integrated circuits. As explained below, the technique of bootstrapping can be used to increase the effective value of the impedance. In particular, using a ladder network in the collector circuits of the transistors, the series impedances of the network may be connected between the output and input of a bootstrapping amplifier.

Thus, according to the invention in another aspect, there is provided a bootstrapped attenuator circuit comprising a variable attenuator having an input connected to the output of an amplifier with voltage gain A and high input impedance, the attenuator having a low-impedance output connected through a series impedance Zb to the input of the amplifier, and the attenuation of the attenuator being B, whereby the input impedance at the input to the amplifier is $Z_b 1/(1-AB)$ and is variable as B is varied.

Embodiments of the invention will now be described, by way of example, with reference to the drawings accompanying the specification, in which.

Figure 1:
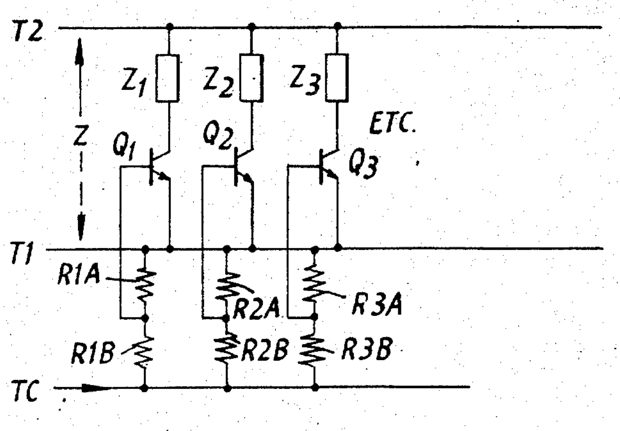
FIGS. 1 and 2 are circuit diagrams of two embodiments.

FIG. 1 shows three transistors Q1, Q2, Q3 (more may be employed) with their emitters connected directly to a first terminal T1 and their collectors connected to a second terminal T2 through individual load impedances Z1, Z2, Z3. A corresponding plurality of potential dividers R1A, R1B, etc. are connected between the terminal T1 and a control terminal TC. The taps of the potential dividers are connected to the bases of the transistors respectively.

The resistors in the potential dividers are so arranged that, as the control signal is gradually raised in amplitude, more and more transistors draw base current. As each transistor begins to conduct, its collector-emitter resistance drops from a very high value to one which is small compared with the impedance in its collector circuit, and hence that collector impedance is added in shunt with those collector impedances whose transistors are already conducting. Thus the impedance Z between T1 and T2 falls from a very high value when the control signal is zero and the law of Z versus control signal amplitude can be tailored by appropriate choice of Z1, etc. and R1A, R1B, etc.

Figure 2:
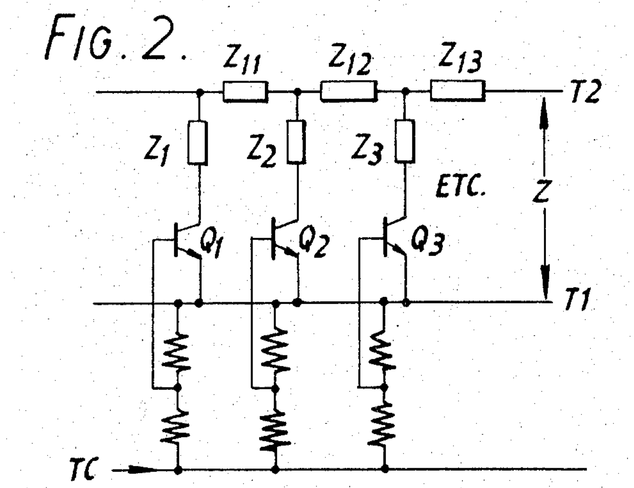

The circuit shown in FIG. 2 is very similar but the shunt impedances Z1, Z2, Z3 are supplemented by series impedances Z11, Z12, Z13 whereby the collectors are connected to T2 by a ladder network, giving further flexibility in design to achieve the required law.

Figure 3:
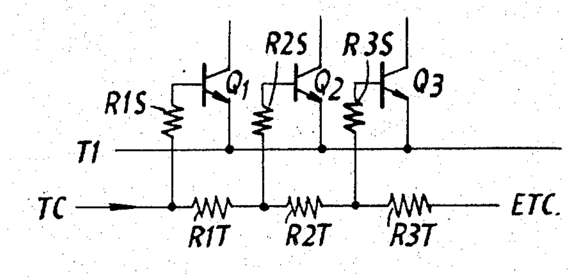
FIG. 3 illustrates a modified base network for FIG. 1 or FIG. 2.

Still further flexibility can be achieved by placing the base-emitter junctions in a ladder network acting as a shaping network for the control signal. The connections to the bases then appear as in FIG. 3 with shunt resistors R1S, etc. and series resistors R1T, etc.

Figure 4:
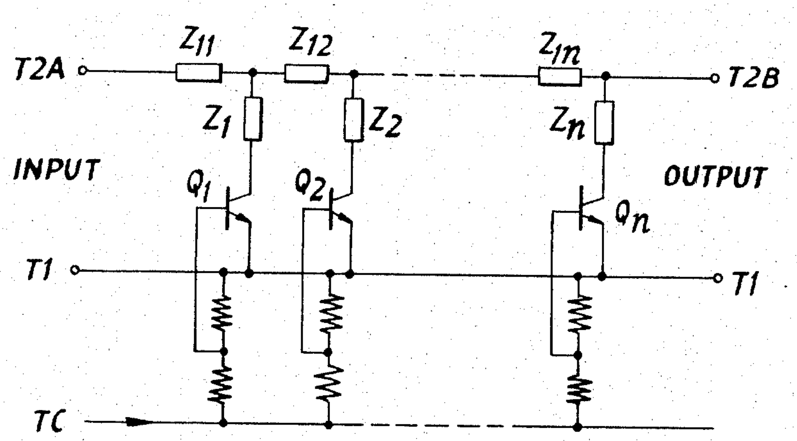
FIG. 4 illustrates the circuit of FIG. 3 in the configuration of a variable attenuator.

The circuits of FIGS. 1 and 2 are illustrated as establishing a variable impedance Z between T1 and T2 and, as such, may replace the FET in FIG. 4 of the aforementioned specification, for example. However they may equally be employed as variable attenuators. This is illustrated for the case of FIG. 2 in FIG. 4 in which the collector ladder network is slightly re-arranged with Z11 preceding Z1, and so on and the general case of $n$ transistors is shown. The input signal is applied at one end of the ladder network between T2A and T1 and the attenuated output is taken at the other end between T2B and T1. The circuit may be regarded as a series of simple attenuators which may be frequency dependent if Z1, Z11 etc. are not pure resistors.

Figure 5:
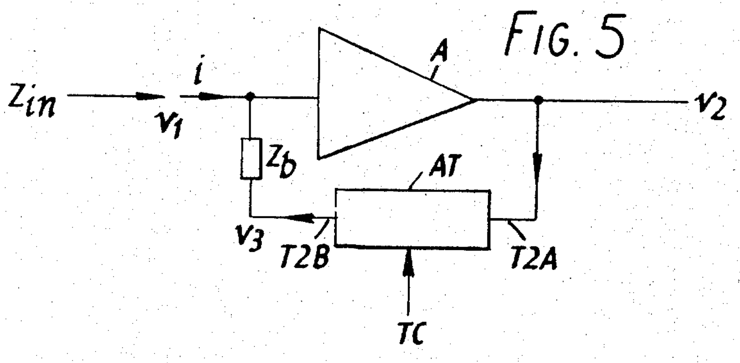
FIG. 5 illustrates the principle of bootstrapping, as applied to a variable attenuator.

As mentioned above, it may be difficult to make the resistors in the collector circuits high enough to achieve the required overall value of Z. The application of bootstrapping to increase the effective value of the impedance in the attenuator configuration is illustrated in FIG. 5. The attenuator AT may be as in FIG. 4 (for simplicity the common terminal T1 is not shown) and is connected in series with an impedance $Z_b$ between the output and the input of an amplifier A. The amplifier has a high input impedance and a voltage amplification A, so that $v_2 = Av_1$. The attenuator has an attenuation B and a low output impedance, so that $v_3 = Bv_2 = ABv_1$. A and/or B may be frequency dependent. Provided that, when the imaginary part of AB is zero, the real part does not exceed unity, this system is stable and the input current $i$ equals $$v_1 - v_3/Z_b = v_1/Z_b\,(1-AB)$$

or input impedance $Z_{in} = v_1/i = Z_b 1/(1-AB)$.

Hence, by varying B between the limits 1/A and O, $Z_{in}$ may be varied between infinity and $Z_b$. When A or B is negative, the circuit degenerates into a conventional negative feedback configuration and $Z_{in}$ may be then reduced to almost zero. The attenuator may be of any type including those incorporating variable impedance as in FIGS. 2 and 3. The highest value of $Z_{in}$ demands that AB shall rise to a value very close to unity, which condition may be difficult to achieve because of drifting of component values with time and temperature. Some applications may require a bigger range of variation of $Z_{in}$ than can be obtained by this bootstrapping system alone.

The attenuator AT of FIG. 5 will normally have a high output impedance. This is of little concern provided $Z_b$ is resistive but, if it is desired that $Z_b$ shall be purely reactive, a low output impedance is required and can be provided by means of a low output impedance amplifier, of emitter follower type for example, inserted between the attenuator AT and the impedance $Z_b$. The attenuation factor B in the foregoing equations must then equal the product of the gains of the attenuator AT itself and of the amplifier.

Figure 7:
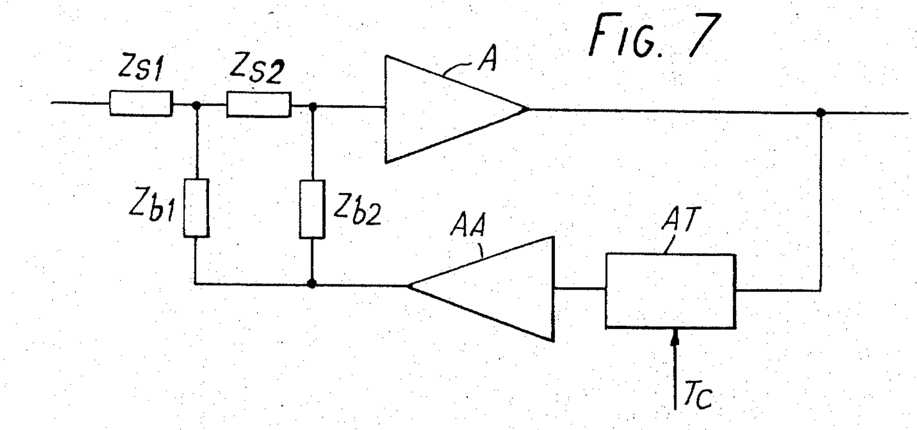
FIG. 7 illustrates a modification of FIG. 5.

This modification is illustrated in FIG. 7 in which the additional amplifier is AA and furthermore, $Z_b$ has been shown as of more complex form, consisting of a $\pi$ network $Z_{b1}$, $Z_{s2}$ and $Z_{b2}$. $Z_{s1}$ is an input resistor. $Z_b$ for the foregoing equations can readily be calculated for the network.

In one specific embodiment, the impedances $Z_{s1}$ and $Z_{s2}$ are resistors (e.g. 5K and 50K respectively), and $Z_{b1}$ and $Z_{b2}$ are both capacitors (e.g. both 1 $\mu F$). The overall circuit of FIG. 7 will then act as a low pass filter with a turnover frequency established at, say, 1.5 KHz when B is at its maximum level. If the control signal TC is derived by rectifying and smoothing a signal derived from the output of the network $Z_{s1}$ to $Z_{b1}$, e.g. the output of the amplifier A and increasing TC increases the attenuation, the turnover frequency will shift downwardly to exclude large signal components in the frequency band below 1.5 KHz. The bootstrapped attenuator can therefore be made the basis of a low frequency band compressor or expander in the manner described (in relation to a high frequency band) in detail in the aforementioned specification. Such a low frequency band compressor and expander would be of use in reducing low frequency noise in disc recordings.

Figure 6:
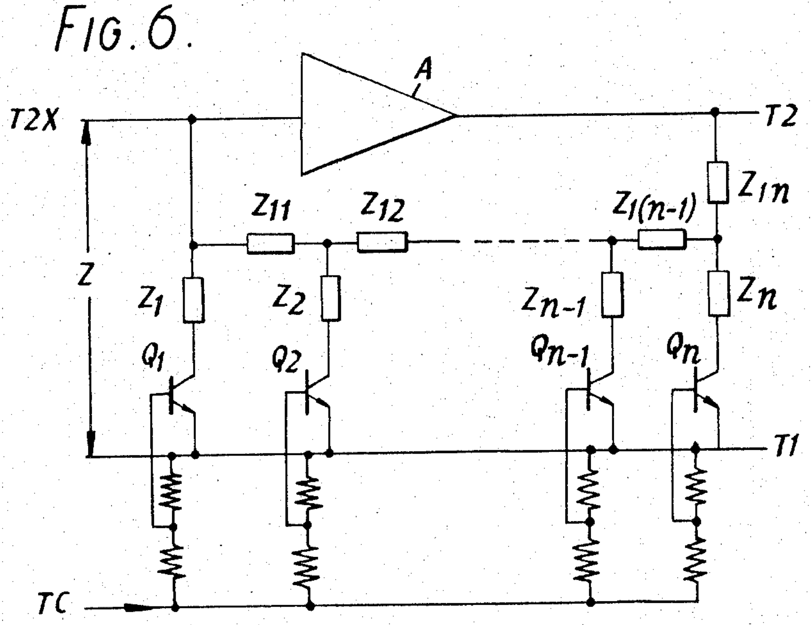
FIG. 6 illustrates the application of bootstrapping to the circuit of FIG. 2.

It is equally possible to combine bootstrapping with the use of the transistors as simple shunt resistors providing a variable impedance, as in FIG. 1 or FIG. 2. FIG. 6 shows bootstrapping applied to FIG. 2 with $n$ transistors Q1 to Qn. The output of the amplifier A is connected to T2. The variable impedance Z is seen between T1 and a terminal T2X connected to the input of the amplifier A and to the junction of Z1 and Z11. The impedances Z11 to Z1n are therefore in a feedback connection from the output to the input of the amplifier.

When none of the transistors Q1 to Qn is conducting, the input impedance Z is determined by the impedance Z11 + Z12 + — + Z1n raised in value by a factor dependent upon A. With the terminology used above, since $B = 1$ (no attenuation), $$Z_b = \sum_{i=1}^{i=n} Z1i$$

so that $$Z = \sum_{i=1}^{i=n} Z1i/(1-A)$$

Again, for stability, the real part of A must not exceed unity when the imaginary part is zero.

The circuit is so arranged that Qn turns on first as the control voltage is increased. With Qn fully conducting, the series impedance chain being bootstrapped contains only ($n$−1) impedances, while B = Zn/(Zn + Z1n). Thus Z has fallen to $$Z = \sum_{i=1}^{i=n-1} Z1i/\left(1 - \frac{A \cdot Zn}{(Zn + Z1n)}\right).$$

As more transistors are turned on the bootstrapping contributes successively less to the input impedance and the circuit reverts to a simple shunt resistance chain (as in FIG. 2).

Although all circuits have been illustrated with npn transistors, it is clear that pnp transistors could be used.

I claim:

1. An audio attenuator comprising an amplifier with voltage gain and having an input and an output, a ladder network having a plurality of series impedances and a plurality of shunt arms connected between the ends of the series impedances and a common terminal, each shunt arm comprising an impedance and a transistor in series therewith, a control circuit connected between a control terminal and control electrodes of the individual transistors and responsive to an increasing control signal applied to the control terminal to render the transistors conductive in cumulative progression from one end of the ladder network to the other, the series impedances being connected between the output and input of the amplifier in a bootstrapped configuration to present an input impedance to the amplifier determined by the sum of the impedances multiplied by $1/(1-A)$ where A is the voltage gain of the amplifier, when no transistor is conducting, and the progressive conduction of the transistors progressively removing the series impedances from the bootstrapping action and progressively increasing the attenuation of the ladder network to progressively decrease said input impedance.

2. An audio attenuator according to claim 1, further comprising a low output impedance amplifier followed by a complex impedance connected between the ladder network and the input of the amplifier.

3. An audio attenuator according to claim 2, wherein the impedance presented by the complex impedance is capacitive.

4. An audio attenuator according to claim 1, wherein the product of the voltage gain of the amplifier and the attenuation of the ladder network is negative.

5. An audio attenuator according to claim 1, wherein the ladder network comprises, in order from the input to the output of the amplifier, a first shunt arm followed by a first series impedance, a second shunt arm followed by a second series impedance, and so on to a last shunt arm followed by a last series impedance, and wherein the control circuit is constructed to render the transistors of the shunt arms cumulatively, progressively conductive starting with the transistor of the last shunt arm, as the control signal increases.

* * * * *